United States Patent
Kriz

(10) Patent No.: US 7,327,197 B2
(45) Date of Patent: Feb. 5, 2008

(54) RADIATION HARDENED PHASE LOCKED LOOP

(75) Inventor: Jeffrey J. Kriz, Eden Prairie, MN (US)

(73) Assignee: Honeywell International, Inc., Morristown, NJ (US)

( * ) Notice: Subject to any disclaimer, the term of this patent is extended or adjusted under 35 U.S.C. 154(b) by 44 days.

(21) Appl. No.: 11/254,281

(22) Filed: Oct. 20, 2005

(65) Prior Publication Data

US 2007/0090886 A1    Apr. 26, 2007

(51) Int. Cl.
  *H03L 7/00*   (2006.01)
  *H03L 7/095*  (2006.01)
  *H03L 7/14*   (2006.01)

(52) U.S. Cl. .......................... 331/17; 331/25; 331/1 A; 331/65; 331/175; 327/156

(58) Field of Classification Search ............ 331/16, 331/17, 18, 25, 1 A, 62, 65, 175, DIG. 2; 327/156, 157
See application file for complete search history.

(56) References Cited

U.S. PATENT DOCUMENTS

| | | | |
|---|---|---|---|
| 4,479,091 A | | 10/1984 | Yoshisato |
| 4,506,233 A | * | 3/1985 | Englund, Jr. ................. 331/17 |
| 5,861,842 A | * | 1/1999 | Hitch et al. ............ 342/357.15 |
| 6,256,362 B1 | | 7/2001 | Goldman |
| 6,441,691 B1 | | 8/2002 | Jones et al. |
| 6,683,930 B1 | | 1/2004 | Dalmia |
| 6,856,202 B2 | | 2/2005 | Lesso |

OTHER PUBLICATIONS

U.S. Appl. No. 11/254,474, filed Oct. 20, 2005, James D. Seefeldt.
U.S. Appl. No. 11/254,569, filed Oct. 20, 2005, James D. Seefeldt, et al.
U.S. Appl. No. 11/254,473, filed Oct. 20, 2005, James D. Seefeldt.
U.S. Appl. No. 11/254,466, filed Oct. 20, 2005, James D. Seefeldt.
Dong Pan, et al, "A Radiation-Hard Phase-Locked Loop," IEEE 2003, pp. 1-6.
Dong Pat et al., "A Radiation-Hard Phase-Locked Loop," Industrial Electronics, 2003, IEEE International Symposium, vol. 2, Jun. 2003, pp. 901-906.
Hafer C. et al., "A RadHard-by-Design Clock Generator," IEEE Conference Big Sky, Mar. 5, 2005, pp. 1-7.
Lyond, Gene, "1.1 GHZ Integer N. Phase Lock Loop With Superior Single Event Upset and Total Dose Properties Suitable For Commercial Space Applications," Proceedings 1998, IEEE International SOI Conference 1998, pp. 101-102.

* cited by examiner

Primary Examiner—Robert Pascal
Assistant Examiner—Ryan J Johnson
(74) Attorney, Agent, or Firm—McDonnell Boehnen Hulbert & Berghoff, LLP

(57) ABSTRACT

A method and apparatus for providing a radiation hardened Phase Locked Loop (PLL) are presented. The radiation hardened PLL includes an adjustable bandwidth loop filter. The adjustable filter modifies an unfiltered voltage control signal and provides a stable voltage control signal to a Voltage Controlled Oscillator (VCO) during detected radiation induced transient events. The adjustable filter filters out radiation effects by decreasing its bandwidth when a radiation event is detected.

19 Claims, 4 Drawing Sheets

RADIATION HARDENED PHASE LOCKED LOOP

GOVERNMENT RIGHTS

The United States Government has acquired certain rights in this invention pursuant to Contract No. DTRA01-03-D-0018 and Delivery No. DTRA01-03-D-0018-0001 awarded by the Defense Threat Reduction Agency.

FIELD

The present invention relates generally to a phase locked loop, and more particularly, a radiation hardened phase locked loop with an adjustable bandwidth loop filter.

BACKGROUND

Phase locked loops (PLLs) have been used extensively in analog electrical systems and communication systems. In today's high performance systems operating within increasingly stringent timing constraints, PLLs are being introduced in more general digital electronic circuits. For example, Application Specific Integrated Circuits (ASIC) used in a variety of circuit applications typically include on-chip PLLs for clock signal distribution.

The key advantages that PLLs bring to clock distribution are phase/delay compensation, frequency multiplication and duty cycle correction. A PLL enables one periodic signal or clock signal to be phase-aligned to frequency multiples of a reference clock signal. As the name implies, the output of the PLL locks onto the incoming reference clock signal and generates a periodic output signal with a frequency substantially equal to the average frequency of the reference clock. This periodic output signal is the PLL output and it is also used to determine a feedback clock signal. When the feedback clock signal tracks the reference signal, the PLL is said to be "locked."

A PLL, however, will only remain locked over a limited frequency range or tuning range called a hold-in or lock range. The PLL generally tracks the reference signal over the lock range, provided the reference frequency changes slowly. If the frequency changes at too fast of a rate, the PLL will drop out of lock. The maximum rate of change of the reference frequency (without loosing lock) is known as the "locked sweep rate."

PLLs are typically designed for a specific frequency or tuning range. A Voltage Controlled Oscillator (VCO) along with a phase comparator are used to create the periodic output signal. The frequency of the periodic output signal is directly dependent on the circuit components within the voltage controlled oscillator and/or phase comparator. The phase comparator compares the reference clock signal with the feedback clock signal and generates a voltage control signal that the VCO is coupled to receive. The phase comparator may also include a charge pump. The charge pump includes circuitry that adjusts the voltage level of the voltage control signal based on the average difference in phase or frequency between the feedback and reference clock signals. The voltage control signal is determined by averaging the output of the charge pump through the use of a low pass filter. The VCO generates the periodic output signal based on the voltage level of the voltage control signal.

Unfortunately, the voltage control signal may often be subject to AC or transient noise and other deleterious effects that impact the periodic output signal of the VCO. In order to reduce deleterious effects such as AC noise, the low pass, or loop filter is tailored to handle both the voltage control signal averaging and minimizing or shaping the response due to noise sources. In developing the loop filter response, a tradeoff between immunity to noise/transient effect and normal considerations of tuning speed and peridoic signal stability must be addressed.

The time constant of the loop filter is inversely proportional to the bandwidth of the loop filter. The width of the bandwidth of the loop filter is directly proportionally to the range of frequencies of signals that the loop filter will allow to pass through it. Because the loop filter is a low-pass type, the bandwidth of the loop filter allows signals having frequencies in the range of zero to a corner frequency, or 3 dB frequency to pass through it. The corner frequency is the frequency at which the gain of the loop filter is reduced by 3 dB relative to the maximum gain of the loop filter.

A large time constant, or a narrow bandwidth (i.e. low corner frequency) loop filter filters out a large range of frequencies. This is beneficial to a PLL because AC noise as well as inadvertent oscillations resulting in voltage spikes or glitches in the unfiltered voltage control signal are mitigated. If the corner frequency is increased, however, a larger range of signal frequencies may be able to impact the periodic output signal of the VCO.

Although small bandwidth loop filters benefit a PLL by filtering out a larger range of voltage control signal noise, they also may have a negative impact on the performance of a PLL. In particular, the narrower the bandwidth of the loop filter, the longer the time it will take the PLL to achieve lock, or capture. In addition, the lock range of frequencies that the PLL will be able to lock onto also decreases with decreasing bandwidth.

In choosing a PLL, therefore, the bandwidth of the loop filter needs to be considered. If the application can tolerate a degree of instability in the waveform signal, a wider bandwidth loop filter may be chosen and the lock speed and range optimized. However, if instability cannot be tolerated a narrower bandwidth loop filter may be chosen and lock speed and range sacrificed.

In radiation hardened applications, however, the consideration of the loop filter may be more difficult. In particular, radiation events such as a Single Event Transients (SETs) are unpredictable. An SET may occur when a particle strike affects a circuit node within the phase comparator or other circuitry before the loop filter. The particle strike may cause unpredictable glitches in the unfiltered voltage control signal. A glitch may be seen as an incorrect reference or divided VCO signal frequency or a transient signal output from the charge pump. The loop filter would not filter these glitches effectively and the periodic output signal would be impacted. A narrower bandwidth loop filter would be required to prevent unpredictable SETs and maintain the correct phase and frequency of the intended clock signal.

Radiation events, such as an SET, may not occur very often, however. The narrower bandwidth loop filter, therefore, would reduce the performance of the PLL for radiation events that do not occur very often.

Therefore, there is a need for a radiation hardened PLL that is optimized for radiation environments.

SUMMARY

A method of operation and an apparatus for a radiation hardened Phase Locked Loop (PLL) are presented.

An example radiation hardened PLL includes a phase comparator, an adjustable bandwidth loop filter, and a Voltage Controlled Oscillator (VCO). The phase comparator derives an unfiltered voltage control signal from a feedback clock signal and a reference clock signal. The adjustable filter filters the unfiltered voltage control signal and produces a filtered voltage control signal. Radiation hardness is achieved by narrowing the bandwidth of the adjustable filter when a radiation event is detected. The filtered voltage control signal is used by the VCO to produce a PLL output signal.

Other examples include various implementations of the adjustable filter. In one example, the adjustable filter includes wide and narrow bandwidth loop filters. In a radiation event, the narrow bandwidth filter is selected. Selecting the narrow bandwidth filter may be carried out by using an upset detect signal. In another example, the adjustable filter includes a continuously tunable bandwidth loop filter. The bandwidth of the continuously tunable bandwidth filter is adjusted by an upset detect signal derived from the AC signal content of the voltage control signal itself. In a radiation event, the bandwidth may increase the range of frequencies it filters. The upset detect signal used by the non-linear bandwidth filter may be generated by an upset detect circuit or it may be derived from the unfiltered voltage control signal.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain examples are described below in conjunction with the appended drawing figures, wherein like reference numerals refer to like elements in the various figures, and wherein.

DETAILED DESCRIPTION

Example radiation hardened Phase Locked Loops (PLLs) are presented. A PLL is radiation hardened by including an adjustable bandwidth loop filter. The adjustable bandwidth filter has at least two filtering modes. In one mode, the adjustable filter filters an unfiltered voltage control signal at a wide bandwidth. This wide bandwidth allows the PLL to have increased lock speed and range. When a radiation event, such as a Single Event Transient (SET), is detected, the adjustable filter operates in a second mode. In the second mode, the adjustable filter filters the unfiltered voltage control signal at a narrow bandwidth. Filtering at a narrow bandwidth allows a wider range of frequencies of error signals, particularly radiation event signals, to be filtered.

Figure 1:
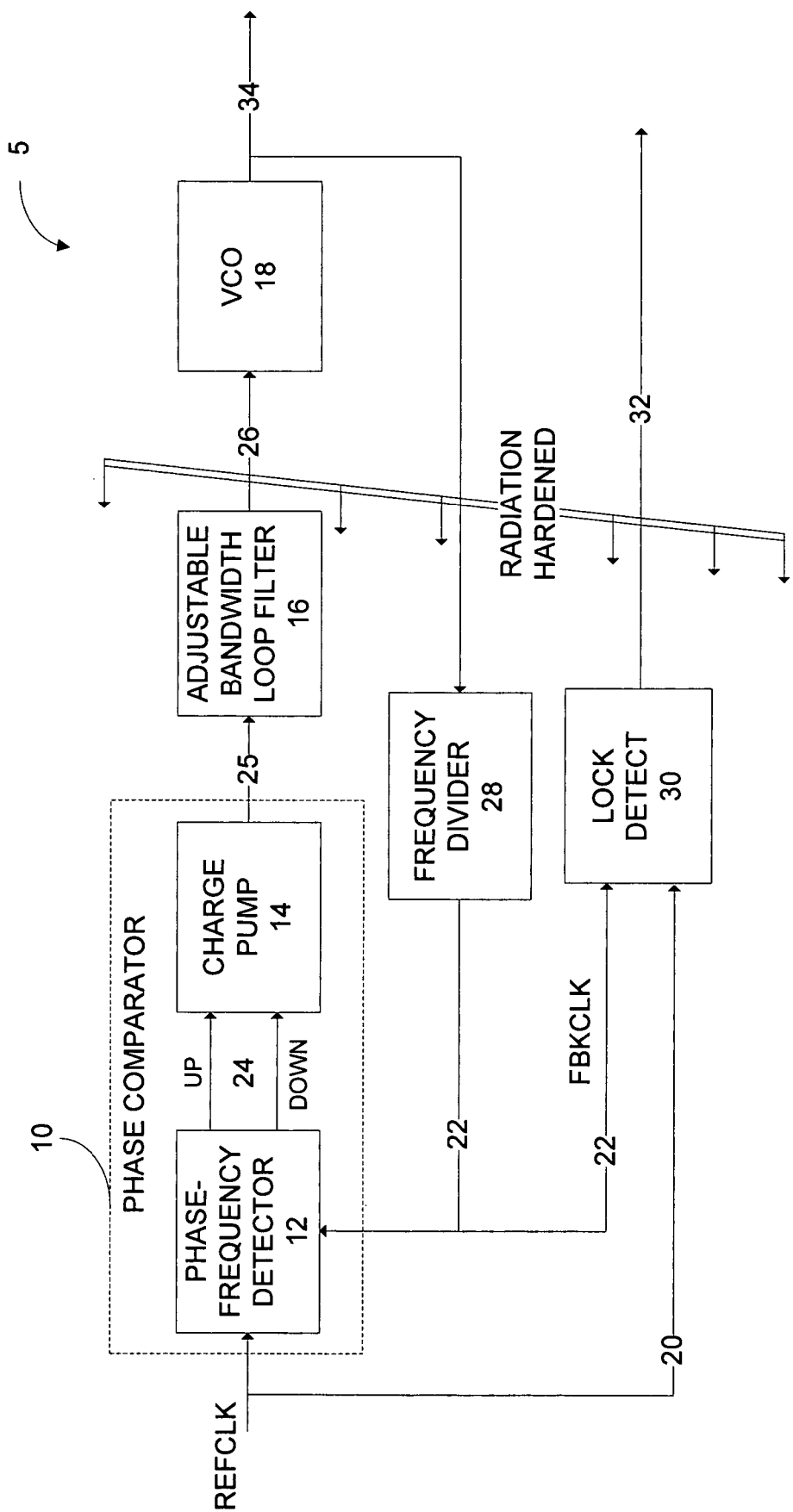
FIG. 1 is a block diagram of a radiation hardened Phase Locked Loop (PLL)

Turning now to FIG. 1, an example PLL 5 is shown that includes a phase comparator 10, an adjustable bandwidth loop (low pass) filter 16, a VCO 18, a frequency divider 28 and a lock detector 30. The phase comparator 10 includes a phase frequency detector 12 and a charge pump 14. The phase-frequency detector 12 receives a reference clock signal via a signal line 20 and a derived (or feedback) clock signal via a signal line 22. The output signal of the phase-frequency detector 12 is communicated to the charge pump 14. An output signal from the charge pump 14 is communicated to the adjustable filter 16. The adjustable filter 16 is coupled with the VCO 18. The VCO 18's output signal is communicated to a frequency divider 28. An output signal of the frequency divider 28 is communicated back to the phase-frequency detector 12 and is also provided to the lock detector 30. The lock detector 30 is also supplied the reference clock signal via a signal line 20 to enable it to provide a lock detect signal on a signal line 32.

In operation, the phase detector 12 compares two input frequencies, generating an output signal that is a measure of their phase difference. For instance, the phase-frequency detector 12 compares the input reference clock signal (REFCLK) with the feedback clock signal (FBKCLK) and generates an error signal that is communicated via signal lines 24. The error signal is proportional to the magnitude of the phase/frequency difference between the two signals. For purpose of illustration, the output signal of the phase detector 12 is shown as up or down pulses communicated on signal lines 24.

The error signal is communicated to the charge pump 14 to reduce the loading of the phase detector 12 of the PLL 5 circuitry. The charge pump 14's output current signal is output on a signal line 25. The charge pump 14's output current signal is an unfiltered voltage control signal which is used to control the magnitude of the charge stored in the adjustable filter 16, thus converting the phase-frequency detector 12's output signals to a filtered control voltage input signal for the VCO 18, which is communicated via a signal line 26. The VCO 18 generates an output signal with a frequency that is proportional to the filtered control voltage signal.

When the PLL 5 is locked, there is a constant phase difference (usually zero) between REFCLK and FBKCLK and their frequencies are matched. If the two signals are substantially equal, their output signal from the phase detector 12 will have an amplitude of approximately zero. If the signals differ, the phase detector 12 outputs a corresponding voltage signal on the signal line 24. In operation, the phase detector 12 compares the REFCLK signal with the oscillator output signal (using the frequency divider 28). This is done with FBKCLK which tracks REFCLK. If FBKCLK oscillator falls behind REFCLK in frequency, the phase detector 12 causes the charge pump 14 to change the filtered control voltage signal, so that the oscillator 18 speeds up. Likewise, if FBKCLK creeps ahead of REFCLK, the phase detector 12 causes the charge pump 14 to change the filtered control voltage signal to slow down the oscillator 18.

If there is AC noise or a glitch on the unfiltered voltage control signal output from the phase comparator 10, the adjustable filter 16 will filter it out so that the PLL 5 tends towards a state where the phase detector 12 makes very few corrections. The result is a stable PLL output signal on signal line 34, which can be used in a variety of applications. One such application may be a clock generation circuit implemented on an integrated circuit.

Although the PLL 5 employs a phase comparator 10 that includes a phase detector 12 and a charge pump 14, other types of phase comparators may be used. The disclosed examples are not limited to the type of phase comparator. The adjustable filter 16 may be used to filter any type of unfiltered voltage control signal. In addition the unfiltered voltage control signal from a phase comparator may be a current signal or a voltage signal.

In effect, the filtered voltage control signal is a radiation hardened version of the unfiltered voltage control signal. Additionally, all of the circuit components (i.e., phase comparator 10, frequency divider 28 and lock detect 30) before the adjustable filter 16 may be affected by a radiation event, such as a particle strike, without causing an SET to occur on the filtered voltage control signal. The PLL 5 is, therefore, radiation hardened by the adjustable filter 16.

The adjustable filter 16 prevents radiation events from affecting its outputs by adjusting its filtering bandwidth. During normal operation (i.e., no radiation event has been detected) the bandwidth of the adjustable filter 16 may be wide, thereby optimizing the lock (or tuning) speed and range of the PLL 5. During a radiation event, however, the adjustable filter narrows the bandwidth of the filter so that a larger frequency range of signals is filtered. Once the PLL 5 returns to normal operation, the adjustable filter 16 may widen its bandwidth to improve lock speed and range.

Figure 2:
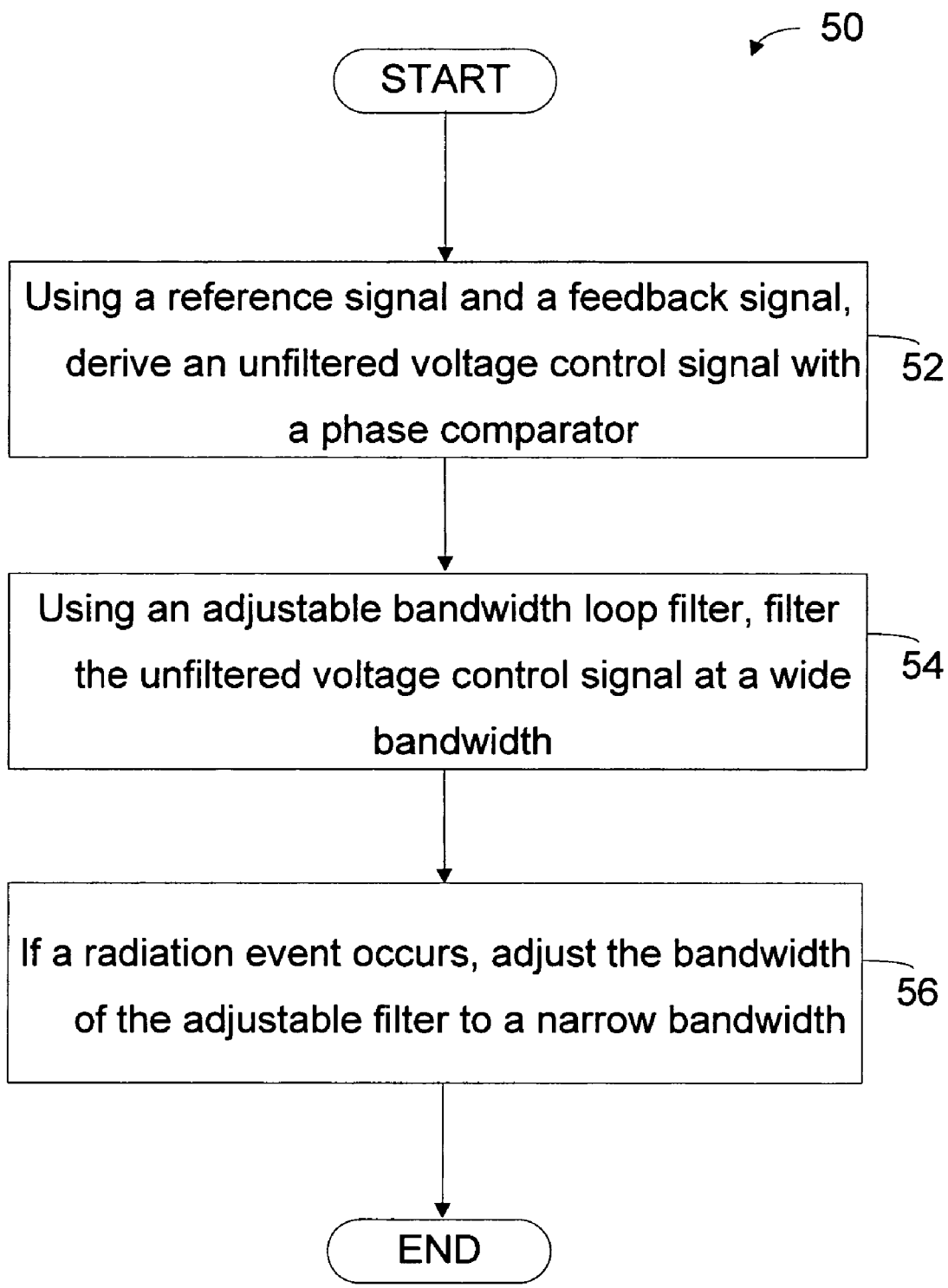
FIG. 2 is a block diagram illustrating a method of operating a radiation hardened PLL.

An example block diagram illustrating a method of operating a radiation hardened PLL is illustrated in FIG. 2. A PLL, having a phase comparator receives a reference clock signal and a feeback clock signal and produces an unfiltered voltage control signal, as shown at block 52. An adjustable bandwidth loop filter filters noise and other transients at a particular bandwidth, as shown at block 54. This particular bandwidth may be determinable by the types of noise that occur during normal operation (i.e., no-radiation events are detected). The filtered voltage control signal is then used to determine the frequency of a periodic output signal from a VCO. When a radiation event is detected, the adjustable filter narrows the bandwidth of the adjustable filter so as to filter noise and other transients resulting from the radiation event, as shown at block 56. The radiation event may be detected after it occurs or while it is occuring at a circuit node. If the radiation event is detected while it is occuring, the adjustable filter may narrow its bandwidth before the radiation event is over. Narrowing the bandwidth allows unpredictable transients, having an unpredictable frequency, to be filtered. Once the radiation event is over, the adjustable filter may widen its bandwidth back to a normal operating level.

In the above example, the lock speed varies. During normal operation the lock speed may be designed to be at an optimized level. During a radiation event the lock speed will be decreased. When the adjustable filter re-adjusts after the radiation event, the lock speed will increase. Operating the adjustable filter in this manner will allow a PLL to be optimized for performance (i.e. lock speed and range), and only decrease in performance when a radiation event is detected. A circuit designer, for example, will not be limited to having a PLL with only one bandwidth and therefore only one lock speed and tuning range.

Figure 3:
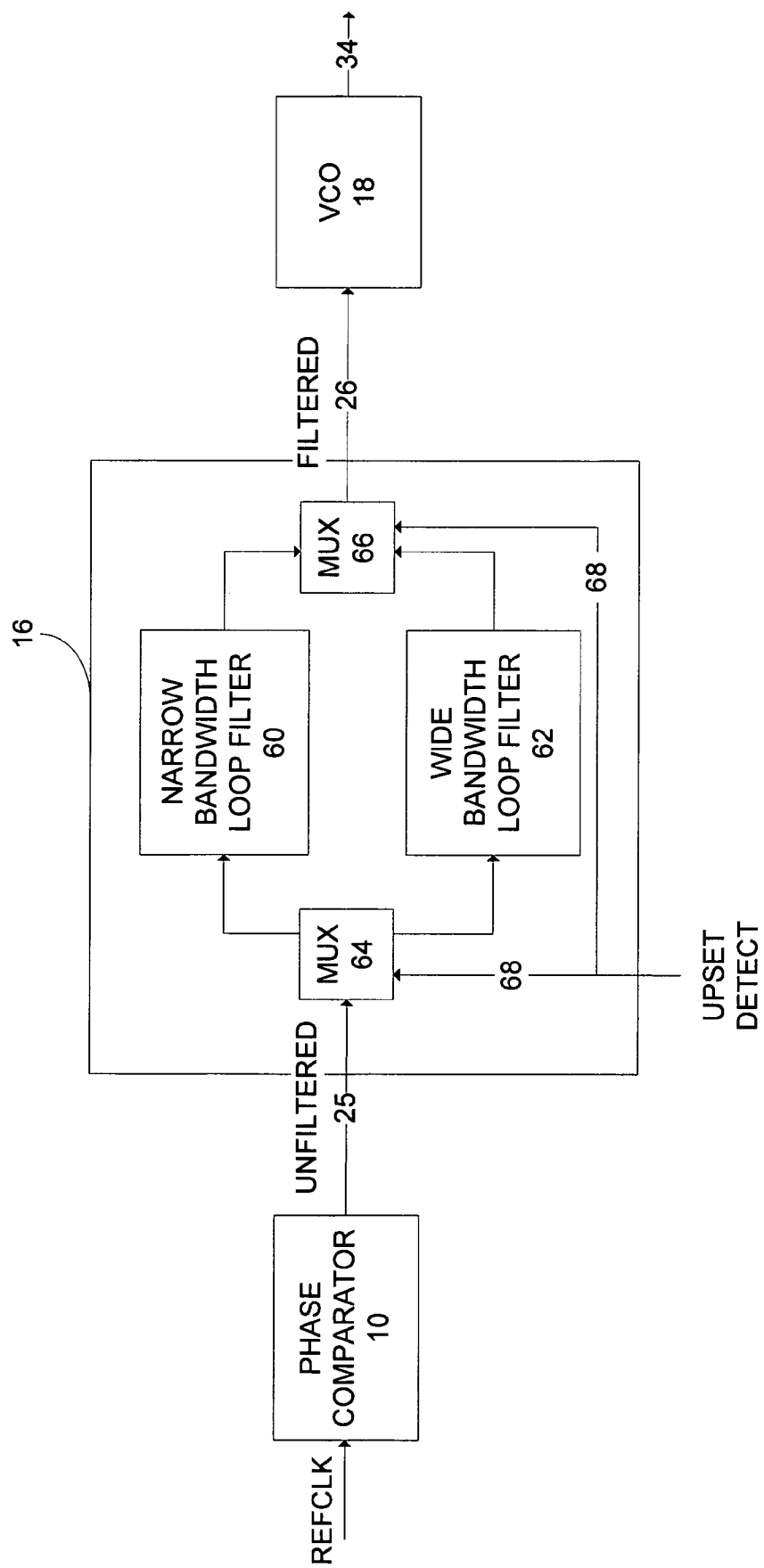
FIG. 3 is a block diagram of an adjustable bandwidth loop filter.

An example adjustable filter 16 is illustrated in FIG. 3. The adjustable filter 16 includes a narrow bandwidth loop filter 60, a wide bandwidth loop filter 62, and multiplexers (MUXes) 64 and 66. The implementation of narrow and wide bandwidth filters 60 and 62 may be referred to as a dual loop filter. The adjustable filter is also coupled to receive an upset detect signal. MUXes 64 and 66 are coupled to receive the upset detect signal on a signal line 68.

During normal operation the upset detect signal indicates that no radiation event has is detected. MUX 64 uses the upset detect signal (as a select input) to route the unfiltered voltage control signal to the wide bandwidth filter 62. The filtered output signal of wide bandwidth filter 62 is selected and output to MUX 66. MUX 66 selects the filtered output signal of wide bandwidth filter 62 as the filtered voltage control signal.

When a radiation event is indicated on the upset detect signal, however, MUX 64 routes, via the upset detect signal, the unfiltered voltage control signal to the narrow bandwidth filter 60. MUX 66 selects the filtered output signal of narrow bandwidth filter 60 as the filtered voltage control signal. When the upset detect signal indicates that the PLL has recovered, or the radiation event is over, the wide bandwidth filter 62 may be selected, via MUXes 64 and 66, to filter the unfiltered voltage control signal.

The upset detect signal may be provided by the PLL 5 or it may be received from a circuit external to the PLL 5. A lock detect signal, such as the lock detect signal provided on signal line 32 in FIG. 1 may be used as the upset detect signal. For example, the lock detect signal 32 generated from lock detect 30 may also indicate radiation events. Alternatively other internal circuitry within the PLL may be configured to detect radiation events and provide the upset detect signal.

The example of FIG. 3 is not limited to the arrangement of MUXes. A single MUX may be used before or after the narrow and wide bandwidth filters 60 and 62. In addition, other logic or circuits besides MUXes may be used to route or select the appropriate filter to be selected in the adjustable filter 16.

Figure 4:
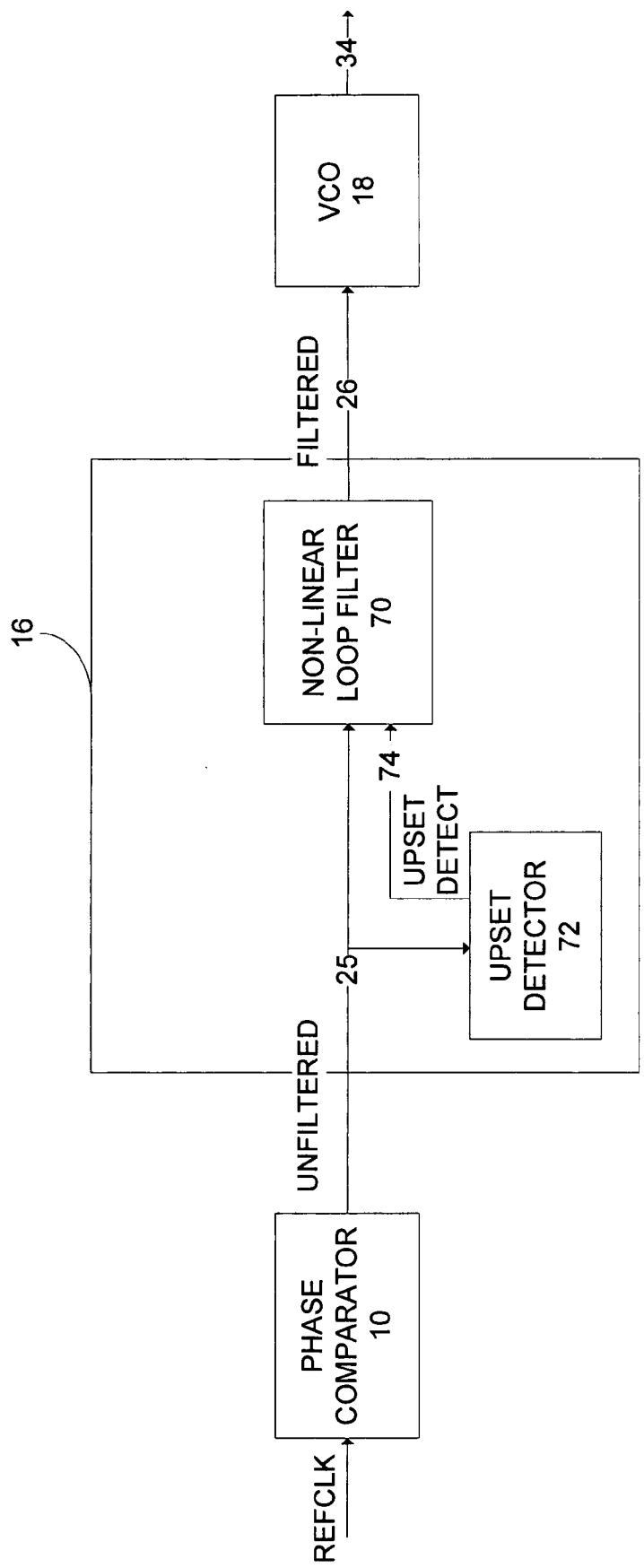
FIG. 4 is a block diagram of another adjustable bandwidth loop filter.

Alternative to the example of FIG. 3, FIG. 4 illustrates an adjustable filter 16 comprising a non-linear loop filter 70 and an upset detector 72. The upset detector is coupled to receive the unfiltered voltage control signal and output the upset detect signal on a signal line 74.

In operation, upset detector 72 receives the unfiltered voltage control signal and determines if a radiation event has been detected. If a radiation event is detected, the upset detector 70 will produce an upset detect signal that indicates an upset has been detected. In response to the upset detect signal indicating an upset, the non-linear loop filter will increase the bandwidth appropriately based upon the level of disturbance. A non-linear response, in contrast to a proportional response, may be used to decrease the bandwidth at an increasing rate as the level of disturbance increases. Hence the term non-linear loop filter is used.

In contrast to the example of FIG. 3, the upset detector may provide an upset detect signal that indicates a frequency range of the non-linear filter. For example, if a minor radiation event is detected and the minor radiation event causes a small glitch, the bandwidth of the non-linear filter 70 may not need to be narrowed as significantly as it is when compared to a major radiation event being detected. Upset detector 72 may measure the degree of the radiation event and derive an appropriate upset detect signal. Upset detector 72 may also be configured to discriminate between radiation and non-radiation events so as to determine the appropriate upset detect signal. Once a PLL has recovered from the radiation event, the upset detect signal may then indicate the filtering range that the non-linear filter 70 should return to.

In another example, not shown in FIG. 4, the upset detector 72 may be omitted and the upset detect signal may be a portion of the unfiltered voltage control signal. For example, if the unfiltered voltage control signal spikes from a low voltage level to a high voltage level in a short time period, this quick spike may indicate a radiation event has been detected. This quick spike would be an upset detect signal which would, in effect, be part of the unfiltered voltage control signal. When this upset detect signal, or portion of the unfiltered voltage control signal, is detected by the non-linear filter 70, it may then narrow its bandwidth. The non-linear filter may derive the upset detect signal from the unfiltered voltage control signal.

The above-described methods and apparatus may be embodied as software code, for example on a carrier medium such as a disk, CD- or DVD-ROM, programmed memory such as read only memory (Firmware), or on a data carrier such as an optical or electrical signal carrier. Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog or VHDL (Very high speed integrated circuit Hardware Description Language). As the skilled person will appreciate, the code may be distributed between a plurality of coupled components in communication with one another. Where appropriate, the above examples may also be implemented using code running on a field-(re-)programmable analog array or similar device in order to configure analog hardware.

The above examples describe a radiation hardened PLL that includes an adjustable bandwidth loop filter. The adjustable bandwidth loop filter allows its bandwidth to decrease (or its time constant to increase) if a radiation event is detected within the PLL. The adjustable loop filter may include many types of filters, including a dual loop filter or a non-linear filter. Additionally, the adjustable filter may receive an upset detect signal that is used to determine the bandwidth of the adjustable filter. It should be understood that the illustrated examples are examples only and should not be taken as limiting the scope of the present invention. The claims should not be read as limited to the described order or elements unless stated to that effect. Therefore, all examples that come within the scope and spirit of the following claims and equivalents thereto are claimed as the invention.

I claim:

1. A method of operating a radiation hardened Phase Locked Loop (PLL), the PLL comprising a phase comparator that produces an unfiltered voltage control signal, an adjustable bandwidth loop filter, and a Voltage Controlled Oscillator (VCO), the method comprising:
   filtering the unfiltered voltage control signal with the adjustable bandwidth loop filter, the filtered voltage control signal coupled to the VCO, the filtered voltage control signal determining the frequency of an output signal of the VCO; and
   when a radiation event is detected, narrowing the bandwidth of the adjustable filter so as to increase the filtering range of the adjustable filter.

2. The method as in claim 1, wherein the adjustable filter comprises a wide bandwidth loop filter and a narrow bandwidth loop filter, the wide and narrow bandwidth filters being selectable, the selected filter filtering the unfiltered voltage control signal.

3. The method as in claim 2, wherein narrowing the bandwidth comprises selecting the narrow bandwidth filter as the selected filter.

4. The method as in claim 3, wherein the adjustable filter is coupled to receive an upset detect signal, the upset detect signal indicating that a radiation event is detected, and that the narrow bandwidth filter is to be selected.

5. The method as in claim 4, further comprising:
   after the radiation event is no longer detected, selecting the wide bandwidth loop filter as the selected filter.

6. The method as in claim 5, wherein the radiation event is a Single Event Transient (SET) type event.

7. The method as in claim 1, wherein the adjustable filter is coupled to receive an upset detect signal, the upset detect signal indicating the radiation event is detected.

8. The method as in claim 7, wherein the upset detect signal indicates a filtering range of the adjustable filter.

9. The method as in claim 8, wherein the upset detect signal is derived from the unfiltered voltage control signal.

10. A method of producing a radiation hardened Phase Locked Loop (PLL) output signal from a PLL, the PLL comprising a Voltage Controlled Oscillator (VCO), the VCO generating the PLL output signal, and the VCO being coupled to receive a voltage control signal, the method comprising:
    determining the PLL output signal by adjusting the voltage level of the voltage control signal;
    filtering the voltage control signal with an adjustable bandwidth loop filter so as to filter out non-radiation event errors on the voltage control signal; and
    when a radiation event is detected, narrowing the bandwidth of the adjustable filter so as to filter out radiation event errors on the voltage control signal.

11. The method as in claim 10, further comprising providing an upset detect signal, the upset detect signal indicating that a radiation event is detected.

12. The method as in claim 11, wherein the adjustable filter is coupled to receive the upset detect signal.

13. The method as in claim 10, wherein non-radiation event errors include signal noise on the voltage control signal.

14. The method as in claim 10, wherein the radiation event is a Single Event Transient (SET) type event.

15. The method of claim 10, further comprising after the radiation event is no longer detected, increasing the bandwidth of the adjustable filter.

16. A radiation hardened Phase Locked Loop (PLL), the PLL comprising:
    a Voltage Controlled Oscillator (VCO) coupled to receive a filtered control signal;
    an adjustable bandwidth loop filter coupled to receive an unfiltered control signal and an upset detect signal, the adjustable filter outputting the filtered control signal, and the adjustable filter, in operation, adjusting the bandwidth of the loop based on the value of the upset detect signal; and
    upset detect circuitry, the upset detect circuitry detecting a radiation event and generating the upset detect signal.

17. The PLL as in claim 16, wherein the radiation event is a Single Event Transient (SET) event.

18. The PLL as in claim 16, wherein the adjustable filter is a dual loop filter comprising a wide bandwidth filter and a narrow bandwidth filter, the upset detect signal selecting the narrow bandwidth filter when a radiation event is detected.

19. The PLL as in claim 16, wherein the adjustable filter is a non-linear type loop filter, the adjustable loop filter providing a plurality of tunable bandwidths that are determined by the upset detect signal.

* * * * *